(12) United States Patent
Uzoh et al.

(10) Patent No.: US 11,515,279 B2
(45) Date of Patent: Nov. 29, 2022

(54) LOW TEMPERATURE BONDED STRUCTURES

(71) Applicant: ADEIA SEMICONDUCTOR BONDING TECHNOLOGIES INC., San Jose, CA (US)

(72) Inventors: Cyprian Emeka Uzoh, San Jose, CA (US); Jeremy Alfred Theil, Mountain View, CA (US); Liang Wang, Newark, CA (US); Rajesh Katkar, Milpitas, CA (US); Guilian Gao, San Jose, CA (US); Laura Wills Mirkarimi, Sunol, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 16/995,988

(22) Filed: Aug. 18, 2020

(65) Prior Publication Data
US 2020/0381389 A1    Dec. 3, 2020

Related U.S. Application Data

(63) Continuation of application No. 16/363,894, filed on Mar. 25, 2019, now Pat. No. 10,790,262.
(Continued)

(51) Int. Cl.
*H01L 23/00* (2006.01)

(52) U.S. Cl.
CPC .............. *H01L 24/26* (2013.01); *H01L 24/03* (2013.01); *H01L 24/09* (2013.01); *H01L 24/27* (2013.01);
(Continued)

(58) Field of Classification Search
CPC . H01L 2224/32502; H01L 2224/32111; H01L 2224/32112; H01L 2224/32135;
(Continued)

(56) References Cited

U.S. PATENT DOCUMENTS 4,939,568 A   7/1990   Kato et al.
4,998,665 A   3/1991   Hayashi
(Continued)

FOREIGN PATENT DOCUMENTS

JP   2002-353416 A   12/2002
JP   2013-33786 A    2/2013
(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Scott B Geyer
(74) *Attorney, Agent, or Firm* — Knobbe, Martens, Olson & Bear LLP

(57) ABSTRACT

Devices and techniques including process steps make use of recesses in conductive interconnect structures to form reliable low temperature metallic bonds. A fill layer is deposited into the recesses prior to bonding. First conductive interconnect structures are bonded at ambient temperatures to second metallic interconnect structures using direct bonding techniques, with the fill layers in the recesses in one or both of the first and second interconnect structures.

22 Claims, 6 Drawing Sheets

Related U.S. Application Data

(60) Provisional application No. 62/656,264, filed on Apr. 11, 2018.

(52) U.S. Cl.
CPC ............. *H01L 24/30* (2013.01); *H01L 24/83* (2013.01); *H01L 2224/08257* (2013.01); *H01L 2924/01025* (2013.01); *H01L 2924/01027* (2013.01); *H01L 2924/01028* (2013.01)

(58) Field of Classification Search
CPC .................... H01L 2224/32145–32148; H01L 2224/32221–32268; H01L 2224/08502; H01L 2224/08145–08148; H01L 2224/08225–08268; H01L 2224/08111; H01L 2224/08112
See application file for complete search history.

(56) References Cited

U.S. PATENT DOCUMENTS

| | | |
|---|---|---|
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,516,727 A | 5/1996 | Broom |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,660,564 B2 | 12/2003 | Brady |
| 6,667,225 B2 | 12/2003 | Hau-Riege et al. |
| 6,828,686 B2 | 12/2004 | Park |
| 6,837,979 B2 | 1/2005 | Uzoh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,962,835 B2 | 11/2005 | Tong et al. |
| 6,974,769 B2 | 12/2005 | Basol et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,126,212 B2 | 10/2006 | Enquist et al. |
| 7,193,423 B1 | 3/2007 | Dalton et al. |
| 7,354,798 B2 | 4/2008 | Pogge et al. |
| 7,485,968 B2 | 2/2009 | Enquist et al. |
| 7,750,488 B2 | 7/2010 | Patti et al. |
| 7,803,693 B2 | 9/2010 | Trezza |
| 7,998,335 B2 | 8/2011 | Feeney et al. |
| 8,039,966 B2 | 10/2011 | Yang et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,434 B1 * | 4/2017 | Joshi ....................... H01L 24/29 |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |

(56) References Cited

U.S. PATENT DOCUMENTS

| | | |
|---|---|---|
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,205 B2 | 11/2020 | Fountain, Jr. et al. |
| 10,879,212 B2 | 12/2020 | Uzoh et al. |
| 10,923,408 B2 | 2/2021 | Huang et al. |
| 10,964,664 B2 | 3/2021 | Mandalapu et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,031,285 B2 | 6/2021 | Katkar et al. |
| 11,056,348 B2 | 7/2021 | Theil |
| 11,088,099 B2 | 8/2021 | Katkar et al. |
| 11,158,606 B2 | 10/2021 | Gao et al. |
| 11,171,117 B2 | 11/2021 | Gao et al. |
| 11,244,920 B2 | 2/2022 | Uzoh |
| 11,256,004 B2 | 2/2022 | Haba et al. |
| 11,276,676 B2 | 3/2022 | Enquist et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0084414 A1 | 5/2004 | Sakai et al. |
| 2006/0024950 A1 | 2/2006 | Choi et al. |
| 2006/0057945 A1 | 3/2006 | Hsu et al. |
| 2006/0097354 A1* | 5/2006 | Ogihara .............. B41J 2/45 257/E21.505 |
| 2007/0096294 A1 | 5/2007 | Ikeda et al. |
| 2007/0111386 A1 | 5/2007 | Kim et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0042815 A1* | 2/2011 | Ikeda .............. H01L 23/488 257/762 |
| 2011/0074040 A1 | 3/2011 | Frank et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0020704 A1 | 1/2013 | Sadaka |
| 2013/0221527 A1 | 8/2013 | Yang et al. |
| 2013/0252399 A1 | 9/2013 | Leduc |
| 2013/0270327 A1* | 10/2013 | Yoon .............. B23K 20/16 228/256 |
| 2013/0320556 A1 | 12/2013 | Liu et al. |
| 2014/0153210 A1 | 6/2014 | Uzoh |
| 2014/0175655 A1 | 6/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0340269 A1 | 11/2015 | Rivoire et al. |
| 2015/0380368 A1 | 12/2015 | Momose et al. |
| 2016/0020183 A1 | 1/2016 | Chuang et al. |
| 2016/0133598 A1 | 5/2016 | Baudin et al. |
| 2016/0276383 A1 | 9/2016 | Chuang et al. |
| 2016/0343682 A1 | 11/2016 | Kawasaki |
| 2017/0012016 A1* | 1/2017 | Joshi .............. H01L 24/32 |
| 2017/0047307 A1 | 2/2017 | Uzoh |
| 2017/0069575 A1 | 3/2017 | Haba et al. |
| 2017/0194271 A1 | 7/2017 | Hsu et al. |
| 2017/0355040 A1 | 12/2017 | Utsumi et al. |
| 2017/0358553 A1* | 12/2017 | Kim .............. H01L 24/92 |
| 2018/0151523 A1 | 5/2018 | Chen et al. |
| 2018/0166411 A1* | 6/2018 | Hine .............. H01L 24/83 |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0181510 A1 | 6/2021 | Katkar et al. |
| 2021/0193603 A1 | 6/2021 | Katkar et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |

(56) References Cited

U.S. PATENT DOCUMENTS

| | | |
|---|---|---|
| 2022/0139869 A1 | 5/2022 | Gao et al. |
| 2022/0165692 A1 | 5/2022 | Uzoh et al. |

FOREIGN PATENT DOCUMENTS

| | | |
|---|---|---|
| JP | 2018-129475 | 8/2018 |
| JP | 2018-160519 A | 10/2018 |
| KR | 10-2016-0066272 | 6/2016 |
| WO | 2005-043584 A2 | 5/2005 |

OTHER PUBLICATIONS

Moriceau, H. et al., "Overview of Recent Direct Wafer Bonding Advances and Applications", Advances in Natural Sciences—Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

Suga et al., "Bump-less Interconnect for Next Generation System Packaging", IEEE, 2001 and ECTC, 2001, 6 pages.

Suga et al., "Feasibility of surface activated bonding for ultra-fine pitch interconnection—a new concept of bump-less direct bonding for system level packaging", IEEE, 2000, 1 page.

International Search Report and Written Opinion for PCT/US2019/024083, dated Jul. 11, 2019, 15 pages.

Akolkar, R., "Current status and advances in Damascene Electrodeposition," Encyclopedia of Interfacial Chemistry: Surface Science and Electrochemistry, 2017, 8 pages.

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, pp. P81-P86.

Ganesan, Kousik, "Capable copper electrodeposition process for integrated circuit—substrate packaging manufacturing," A dissertation presented in partial fulfillment of the requirments for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrustion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of The Electrochemical Society, 2018, vol. 165, No. 7, pp. D251-D257.

Huang, Q., "Impurities in the electroplated sub-50 nm Cu lines: The effects of the plating additives," Journal of The Electrochemical Society, 2014, vol. 161, No. 9, pp. D388-D394.

Jiang, T. et al., "Plasticity mechanism for copper extrusion in through-silicon vias for three-dimensional interconnects," Applied Physics Letters, 2013, vol. 103, pp. 211906-1-211906-5.

Juang, Jing-Ye et al., "Copper-to-copper direct bonding on highly (111)-oriented nanotwinned copper in no-vacuum ambient," Scientific Reports, Sep. 17, 2018, vol. 8, 11 pages.

Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.

Liu, C. et al., "Low-temperature direct copper-to-copper bonding enabled by creep on (111) surfaces of nanotwinned Cu," Scientific Reports, May 12, 2015, 5:09734, pp. 1-11.

Liu, Chien-Min et al., "Effect of grain orientations of Cu seed layers on the growth of <111>-oriented nanotwinned Cu," Scientific Reports, 2014, vol. 4, No. 6123, 4 pages.

Liu, Zi-Yu et al. "Detection and formation mechanism of micro-defects in ultrafine pitch Cu-Cu direct bonding," Chin. Phys. B, 2016, vol. 25, No. 1, pp. 018103-1-018103-7.

Lu, L. et al., "Grain growth and strain release in nanocrystalline copper," Journal of Applied Physics, vol. 89, Issue 11, pp. 6408.

Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

Mott, D. et al., "Synthesis of size-controlled and shaped copper nanoparticles," Langmuir, 2007, vol. 23, No. 10, pp. 5740-5745.

Ortleb, Thomas et al., "Controlling macro and micro surface topography for a 45nm copper CMP process using a high resolution profiler," Proc. Of SPIE, 2008, vol. 6922, 11 pages.

Parthasaradhy, N.V., "Practical Electroplating Handbook," 1989, Prentice-Hall, Inc., pp. 54-56.

Saraswat, Stanford Presentation, Cu Interconnect slides, web page web.stanford.edu/class/ee311/NOTES/Cu_Interconnect_Slides.pdf, 19 pages.

Song, Xiaohui, "Atomic study of copper-copper bonding using nanoparticles," Journal of Electronic Packaging, Jun. 2020, vol. 142, 5 pages.

Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.

Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

Takahashi, K. et al., "Transport phenomena that control electroplated copper filling of submicron vias and trenches," Journal of The Electrochemical Society, 1999, vol. 146, No. 12, pp. 4499-4503.

Zheng, Z. et al., "Study of grain size effect of Cu metallization on interfacial microstructures of solder joints," Microelectronics Reliability, 2019, vol. 99, pp. 44-51.

\* cited by examiner

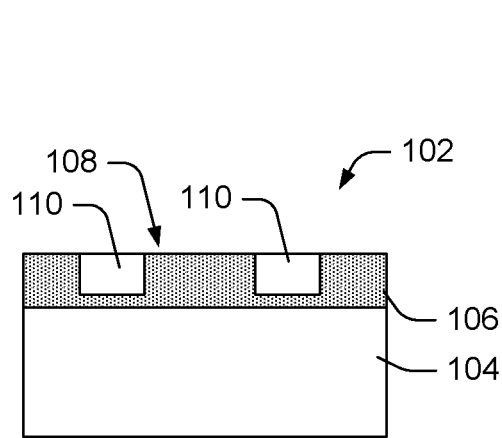
FIG. 1A
FIG. 1B
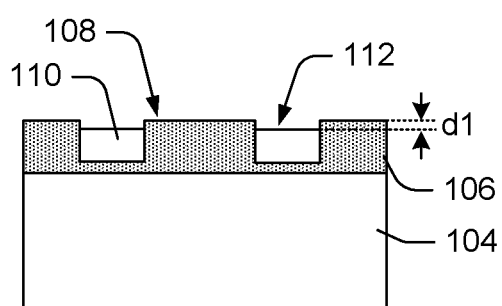
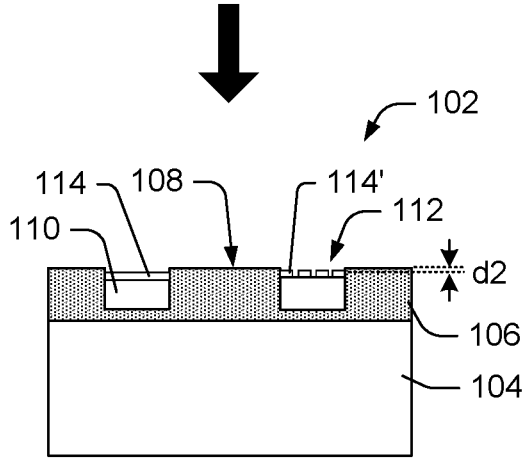
FIG. 1C
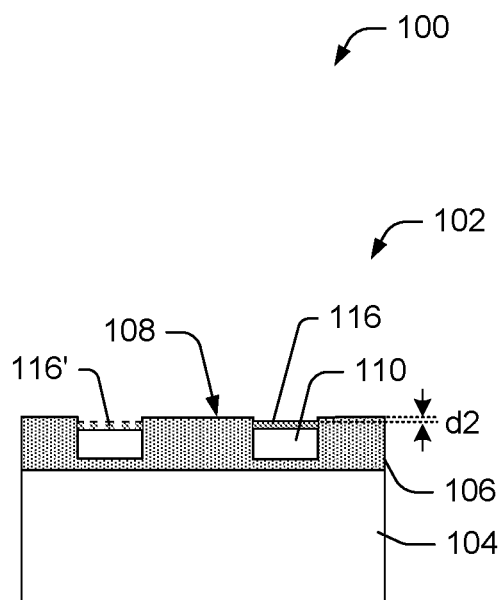
FIG. 1D
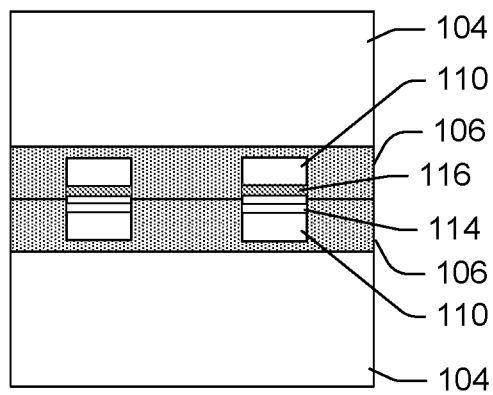
FIG. 1E
CONTINUES AT NEXT SHEET

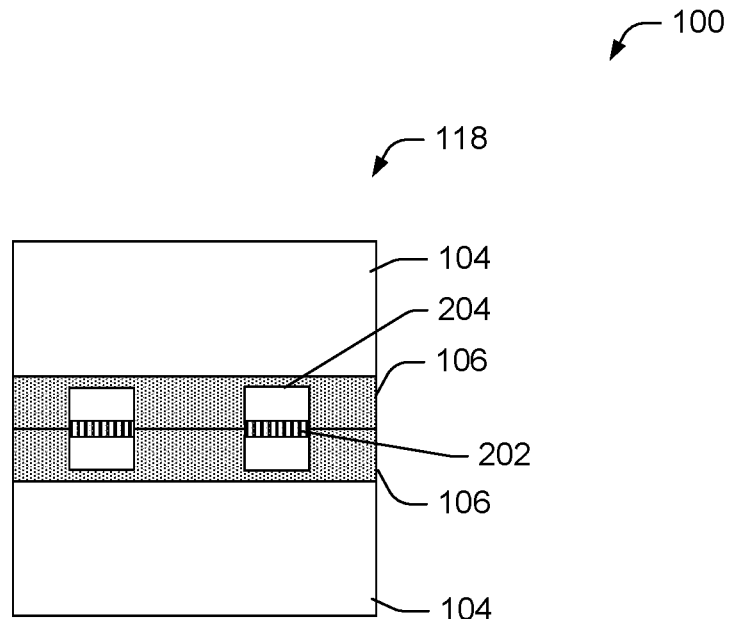
FIG. 1F
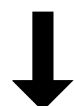
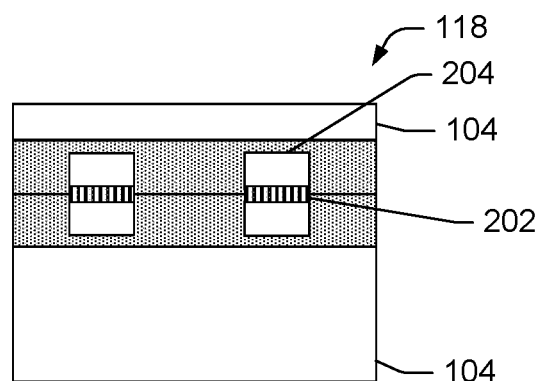
FIG. 1G

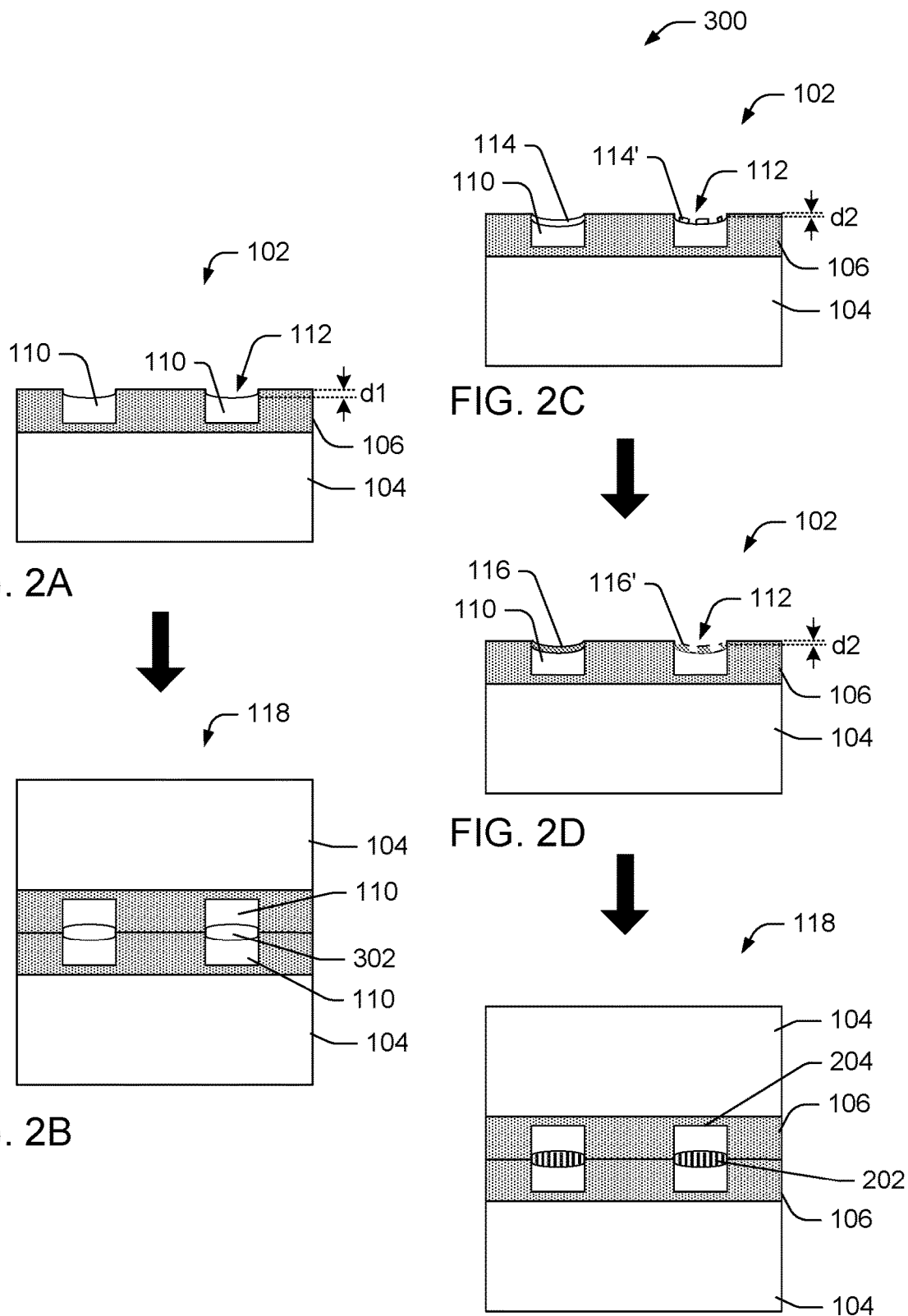

LOW TEMPERATURE BONDED STRUCTURES

PRIORITY CLAIM AND CROSS-REFERENCE TO RELATED APPLICATION

This application is a Continuation of U.S. patent application Ser. No. 16/363,894, filed Mar. 25, 2019, which claims the benefit under 35 U.S.C. § 119(e)(1) of U.S. Provisional Application No. 62/656,264, filed Apr. 11, 2018, both of which are hereby incorporated by reference in their entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology nanometer scale variance), so that the surfaces can be closely mated to form a lasting bond.

However, some processing techniques, such as chemical-mechanical polishing (CMP) and the like, which are used to prepare the bonding surfaces can also contribute to forming uneven bonding surfaces, particularly when the bonding surfaces include varying materials of varying densities. For instance, embedded metallic structures at the bonding surface can be excessively recessed during bonding surface polishing, and to a greater degree when the metallic structures have large exposed surface areas.

Further, it can be desirable to bond the embedded metallic structures of adjacent stacked dies to form conductive interconnects between the dies. Generally, the metallic structures are bonded using heated annealing techniques to form diffusion bonds. However, the temperatures used to perform the annealing techniques can often be too great for some desirable packaging schemes or components or at least one or more materials in the package, thus limiting the types of schemes and components or combination of materials that may take advantage of these techniques.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIGS. 1A-1G include a graphical flow diagram illustrating an example process for forming and bonding dies, according to an embodiment.

FIGS. 2A-2E include a graphical flow diagram illustrating another example process for forming and bonding dies, according to an embodiment.

SUMMARY

Figure 3A:
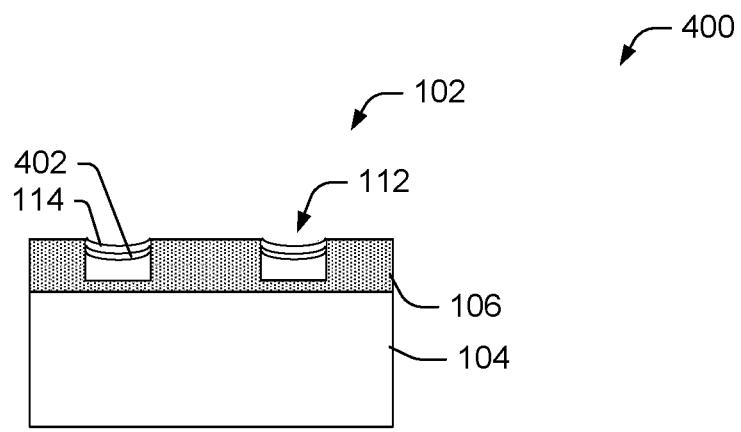
FIGS. 3A-3C include a graphical flow diagram illustrating an alternate example process for forming and bonding dies, according to an embodiment.

Representative techniques and devices are disclosed, including process steps for making use of recesses in interconnect structures to form reliable low temperature metallic (e.g., hybrid) bonds. In various implementations, first metallic interconnect structures may be bonded at ambient temperatures to second metallic interconnect structures using direct bonding techniques, which make use of the recesses in one or both of the first and second interconnect structures. The recesses may be formed in the interconnect structures for this purpose, or recesses resulting from CMP (and the like) may be remedied with this innovative technique. Interconnect pads with larger surface areas and others with deeper dishing can particularly benefit.

In various implementations, a method for forming a microelectronic assembly includes planarizing a bonding surface of a first substrate, where the first substrate includes a first metallic pad embedded into the bonding surface of the first substrate, and depositing a first metallic material onto a surface of the first metallic pad. Also, planarizing a bonding surface of a second substrate, where the second substrate includes a second metallic pad embedded into the bonding surface of the second substrate, and depositing a second metallic material onto a surface of the second metallic pad. Then, bonding the bonding surface of the second substrate to the bonding surface of the first substrate via direct bonding without adhesive.

In an implementation, the method includes depositing the first metallic material and/or the second metallic material via immersion electroless metal deposition, or a like technique. In another implementation, the method includes forming a eutectic alloy mass between the first metallic pad and the second metallic pad, where the eutectic alloy mass or near eutectic composition alloy mass comprises an alloy of the first and second metallic materials.

The method may include forming a first recessed portion in a surface of the first metallic pad and a second recessed portion in a surface of the second metallic pad, and at least partially filling the first recessed portion with the first metallic material and at least partially filling the second recessed portion with the second metallic material. In some embodiments, the method includes depositing a conductive barrier layer onto the surface of the first metallic pad and/or the surface of the second metallic pad prior to depositing the first metallic material or the second metallic material, respectively.

In additional implementations, techniques and methods include forming a microelectronic assembly, comprising a first substrate having a bonding surface with a planarized topography and a first plurality of metallic pads or traces or combinations of thereof at the bonding surface of the first substrate and a second substrate having a bonding surface with a planarized topography, which is bonded to the bonding surface of the first substrate. A second plurality of metallic pads at the bonding surface of the second substrate are bonded to the first plurality of metallic pads. The first plurality of metallic pads and/or the second plurality of metallic pads are comprised of two or more conductive materials.

In some implementations, a first recessed portion is disposed in a surface of the first plurality of metallic pads that extends a preselected depth below the surface of the first plurality of metallic pads, or a preselected depth below the bonding surface of the first substrate. The first recessed portion is at least partially filled with a first conductive material different than a conductive material of the first plurality of metallic pads. Further, a second recessed portion may be disposed in a surface of the second plurality of metallic pads that extends a preselected depth below the surface of the second plurality of metallic pads, or a preselected depth below the bonding surface of the second substrate. The second recessed portion is at least partially filled with a second conductive material different than a conductive material of the second plurality of metallic pads.

In an alternate implementation, a barrier layer is disposed within the first recessed portion and/or the second recessed portion. The barrier layer is comprised of a third conductive material different from the first or second conductive materials and different than the conductive material of the first or second plurality of metallic pads.

In some implementations, an alloy mass (e.g., a eutectic alloy mass) is disposed between the first plurality of metallic pads and the second plurality of metallic pads, where the alloy mass comprises an alloy of the first and second conductive materials. In some examples, the region between the first plurality of metallic pads or the second plurality of metallic pads and the alloy mass is non-linear.

Various implementations and arrangements are discussed with reference to electrical and electronics components and varied carriers. While specific components dies, wafers, integrated circuit (IC) chip dies, substrates, etc.) a mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

FIGS. 1A-5 illustrate representative devices, as well as processes 100, and 300-600 for forming and preparing various microelectronic components (such as dies 102 and assemblies 118, for example) for bonding, such as for direct bonding without adhesive. The processes 100, and 300-600 include providing a bonding surface (such as bonding surface 108, for example) on the microelectronic components, or two bonding surfaces in some examples (not shown), providing conductive interconnect structures embedded into the bonding surfaces, repairing or mitigating erosion, dishing, and the like in the bonding surfaces due to processing or defects, forming microelectronic assemblies by directly bonding the microelectronic components at the bonding surfaces, and so forth.

The order in which the processes 100, and 300-600 are described is not intended to be construed as limiting, and any number of the described process blocks in any of the processes 100, and 300-600 can be combined in any order implement the processes, or alternate processes. Additionally, individual blocks may be deleted from any of the processes without departing from the spirit and scope of the subject matter described herein. Furthermore, the processes 100, and 300-600 can be implemented in any suitable hardware, software, firmware, or a combination thereof, without departing from the scope of the subject matter described herein. In alternate implementations, other techniques may be included in the processes 100, and 300-600 in various combinations and remain within the scope of the disclosure.

Referring to FIG. 1A, a representative "die" 102 may be formed using various techniques, to include a base substrate 104 and an insulating or dielectric layer 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like.

A bonding surface 108 of the die 102 can include conductive features 110, such as interconnect structures for example, embedded into the insulating layer 106 and arranged so that the conductive features 110 from respective bonding surfaces 108 can be mated and joined during bonding, if desired. The joined interconnect features 110 can form continuous conductive interconnects (for signals, power, etc.) between stacked dies 102.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. The conductive features 110 may be included in the insulating layer 106 to provide an electrical and/or thermal path or may instead be configured to balance out the metallization of the bonding surface 108, through the use of additional pads or so-called dummy pads, traces, patterns or the like. After the conductive features 110 are formed, the exposed surface of the die 102, including the insulating layer 106 and the conductive features 110 can be planarized to form a flat bonding surface 108.

As shown in FIG. 1A, one or more bonding surfaces 108 of a die 102, including embedded interconnect structures 110, can be planarized (using chemical-mechanical polishing (CMP), or the like) to prepare the surface(s) 108 for bonding. Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topology variance. Various conventional processes, such as chemical mechanical polishing (CMP) may be used to achieve the low surface roughness. This process provides the flat, smooth surface 108 that results in a reliable bond between dies 102. In some cases, the exposed surface of the conductive features 110 may be intentionally recessed, to allow for material expansion, particularly during heated annealing, if it is to be performed.

As shown in FIG. 1B, as a result of the discontinuity in the properties (difference in mechanical properties, polishing rates, etc.) of the material (e.g., metal, etc.) of the interconnect features 110 and the dielectric material of the insulating layer 106, and their respective interactions with the polishing pad, its hardness, polishing slurry, and other process parameters, the planarizing can produce dielectric erosion (not shown) on the bonding surface 108 in areas with high metal pattern density, and dishing (i.e., recesses 112) in the exposed surface of metal features 110. In general, the higher the metal pattern density on the surface 108, the greater the erosion, and similarly, the larger the area of the surface of the metal features 110, the greater (i.e., deeper) the recesses 112.

As shown at FIG. 1B, the dishing of the features 110 can create a notable variance (having a depth ("d1"), for example) in the overall surface topology of the die 102. In some cases, the topology variance may be great enough to weaken a direct bond between dies 102 or reduce the reliability of the bond at the locations of the surface variance(s) (e.g., recesses 112).

Among the consequences of excessive recesses 112 on the exposed surface of interconnect features 110 is poor flatness of the surface of the interconnect features 110 and much higher temperatures typically needed to form continuous conductive interconnections between the metal features 110 of the dies 102 than the lower temperatures often desired. With conductive features 110 having very large area pads, recesses 112 can be too deep with respect to the opposing interconnect features to mate intimately without undesirable voiding defects, as the metal may not expand enough at annealing temperatures to form a bonded continuous conductive layer. Thus, the poor flatness on the surface of the conductive features 110 often produces defective bonds, when the surface is bonded or attached to other devices or substrates.

However, in various embodiments, dishing or recesses 112 having a preselected depth ("d1") may be intentionally formed in the surface of a conductive feature 110, to prepare the conductive feature 110 for low temperature (e.g., ambient, room temperature, less than 100° C.) bonding techniques, as disclosed herein. Intentional forming of recesses 112 at a preselected depth ("d1") may be accomplished while forming the conductive features 110, or may be accomplished afterwards, with planarization, etching, or the like. In some embodiments, the preselected depth ("d1") of the recess 112 may be dependent on the surface area of the exposed portion of the conductive feature 110. For instance, a conductive feature 110 with a larger surface area and/or thicker conductive layer may have or be provided with a deeper recess 112, and a conductive feature 110 with a smaller surface area and/or thinner conductive layer may have or be provided with a more shallow recess 112.

EXAMPLE EMBODIMENTS

Techniques and devices include process steps that make use of recesses 112 in interconnect features 110 to form reliable low temperature metallic bonds. In the implementations, first metallic interconnect features 110 at a first die 102 may be bonded at ambient temperatures (e.g., less than 100° C.) to second metallic interconnect features 110 at a second die 102 using direct bonding techniques, which make use of the recesses 112 in one or both of the first and second interconnect features 110. The recesses 112 may be formed in the interconnect features 110 for this purpose, or recesses 112 resulting from CMP (and the like) may be remedied with this innovative technique. Interconnect features 110 with larger surface areas and others with deeper dishing can particularly benefit.

Referring to FIGS. 1C and 1D, in an implementation, the recess(es) 112 in the metallic interconnect features 110 are filled with one or more conductive metal, etc.) fill layers 114 and/or 116 that form a conductive alloy mass 202 (see FIGS. 1F and 1G) when the interconnect features 110 with the fill layers 114, 116 are pressed together. In other words, in some embodiments, the one or more additional metal fill layers 114, 116 in each of the first and second interconnect features 110 fuse together upon intimate contact to form the conductive alloy mass 202, which also fuses to the respective first and second interconnect features 110, forming a low-temperature bonded conductive interconnect 204. In some embodiments, the conductive alloy mass 202 comprises a eutectic alloy mass or a composition close to a eutectic alloy mass.

In an embodiment, the metal fill layers 114 and 116 at the respective first and second interconnect features 110 fuse together to form the conductive alloy mass 202 at a comparatively lower temperature than needed to fuse the first and second interconnect features 110 (by annealing, etc.). The bonding temperature of the layers comprising the conductive alloy mass 202 (including fill layers 114 and 116) is lower than the bonding temperature of the opposing layers comprising the interconnect features 110 without the fill layers 114 or 116. In some embodiments, the melting point of the fill layer 114 and/or the fill layer 116 is lower than the melting point of the materials of one or both of the first and second interconnect features 110. The materials of the one or more metal fill layers 114, 116 may be selected so that the combination of materials forms an alloy with a higher melting point than either of the fill layers 114 and 116, and of the metal of the first and/or second interconnect features 110.

For instance, as shown at FIG. 1C, a first metal fill layer 114 is formed, added, deposited, coated, or the like, on the exposed surface of the first interconnect features 110 of the first die 102. The fill layer 114 is formed at a preselected thickness to reduce the recess 112 from the greater depth ("d1") to a lesser depth ("d2"). For example, the depth ("d2") can be a desired or preselected depth, chosen for material expansion and to allow for a reliable direct bond. In various embodiments, the depth ("d2") may be dependent on the materials of the first interconnect features 110, the materials of the first fill layer 114, the size or area of the first interconnect features 110, the temperature and duration of the annealing process to take place, and the like.

Although only one depth ("d1") is shown at FIG. 1B, indicating only one recess depth, two or more such depths are also possible on the same die 102 depending on the size of the pads of the first interconnect features 110, or other reasons as mentioned earlier. Adding the fill layers 114 and 116 can also form two or more corresponding depths ("d2") at the same die 102 as well.

In an implementation, the first fill layer 114 may be selectively electrolessly plated, vapor coated, or deposited by atomic layer deposition methods (or the like) onto the surface of the first interconnect features 110. Also, the first fill layer 114 may be continuous (as shown at FIG. 1C, at 114) or discontinuous (as shown at FIG. 1C at 114'). In an embodiment, the first fill layer 114 may be comprised of indium, alloys of indium or a similar metal or material. A discontinuous fill layer 114' is less likely to decrease the conductivity of the materials of a bonded structure including the fill layer 114,' being a very thin layer, while still strengthening bonded material between interconnect structures 110.

As shown at FIG. 1D, a second metal fill layer 116 is formed, added, deposited, or the like, on the exposed surface of the second interconnect features 110 of the second die 102. As previously, the fill layer 116 can be formed at a preselected thickness to reduce the recess 112 to a desired depth (d2, or a depth d2' that is not necessarily identical to the depth "d2" as shown at FIG. 1C). In an embodiment, the second fill layer 116 may be selectively electrolessly plated, vapor coated, or deposited by atomic layer deposition methods (or the like) onto the surface of the second interconnect features 110. Also similarly, the second fill layer 116 on interconnect features 110 of the second die 102 or substrate may be continuous (as shown at FIG. 1D, at 116) or discontinuous (as shown at FIG. 1D at 116'). In an embodiment, the second fill layer 116 may be comprised of gallium, tin, their respective alloys, or a similar metal or material.

In some embodiments, the first fill layer 114 and the second fill layer 116 comprise different materials. However, in an alternate embodiment, the first 114 and second 116 fill layers comprise the same material. In some alternate embodiments, additional fill layers (not shown) may be added to the first 114 and/or the second 116 fill layers (either before or after deposition of the first 114 and/or second 116 fill layers). Although fill layers 114 and 116 are discussed herein as metal layers, each may be a combination of two or more metals, two or more alloys, or the like.

The first 114 and second 116 fill layers may be deposited on the recessed interconnect features 110 by various means in different implementations, in one implementation, an electroless process, such as a direct replacement reaction or an auto-catalytical metal deposition process is used to selectively deposit the fill layer 114, 116 over the recessed interconnect features 110 (e.g., copper) with precision control. In one example, an electroless immersion deposition process may be used. In various embodiments, such a process may be used to deposit first 114 and second 116 fill layers of gold, silver, palladium, nickel, indium, gallium, cobalt, germanium, or any other metals, or combinations of the same, or the like. In the embodiments, the process maintains a low cost, since it uses no lithography, no vacuum, no heat, and no additional CMP is required after deposition.

In another embodiment, an additional CMP step may be performed on one or both the dies 102 (or wafers). Since two or more recesses 112 are possible on the die 102 (or wafer) depending on the different diameters of the pads 110, a polishing or CMP step may remove material from some pads 110 and not from others.

As shown at FIG. 1E, the first and second dies 102 are bonded using direct dielectric to dielectric bonding (without adhesive), at ambient temperature (e.g., below 100 degrees C.). This includes bringing the non-metallic regions of the prepared bonding surface 108 of each die 102 together so that the bonding surfaces 108 make contact, and bond to each other. The bonding of the first and second dies 102 forms a microelectronic assembly 118. In alternate embodiments, the insulating layer 106 of a die 102 is direct bonded to another insulating layer 106 of a same or similar material on another die 102, or in some examples the other die 102 may not have a separate insulating layer 106 and the bonding happens between the insulating layer 106 of die 102 (e.g. silicon oxide) and a silicon layer, for example, on the other die 102.

In the process, the first fill layer 114 and the second fill layer 116 are pressed together, to bond the interconnect features 110 into a solid interconnect structure 204 at a subsequent temperature lower than 200° C. and preferably lower than 170° C. or 100° C. In one embodiment, the composition of the first fill layer 114 and/or the second fill layer 116 is less than 25% and preferably less than 10% of the bonded conductive feature 204. In some embodiments, the intimate mating of the first fill layer 114 and the second fill layer 116 may comprise thermal deformation of the fill layer 114 and/or the fill layer 116. In other applications, a conductive composite comprising the materials of the interconnect features 110 and the materials of the fill layer 114 of the first die 102 may bond with a conductive composite comprising the materials of the interconnect features 110 and the materials of the fill layer 116 of the second die 102 by thermal deformation and grain boundaries diffusion processes.

As shown at FIG. 1F, the first fill layer 114 and the second fill layer 116 combine to form an alloy mass 202, which physically and electrically bonds the respective interconnect features 110, forming the interconnect structure 204. In various embodiments, the alloy mass 202 comprises a region between the first and second interconnect features 110 (of the bonded interconnect 204 formed by bonding the first and second interconnect features 110) having a non-linear concentration of materials. In other words, the first fill layer 114 and the second fill layer 116 combine to form the alloy mass 202, but the concentration of the first fill layer 114 to the second fill layer 116 is non-linear throughout the alloy mass 202 within the bonded interconnect structure 204.

In an embodiment, the alloy mass 202 comprises an electrically conductive alloy mass 202 joined to the first and second conductive interconnect features 110, where the conductive alloy mass 202 includes a first material comprising the material of the first interconnect feature 110 (of the first die 102), a second material comprising the material of the second interconnect feature 110 (of the second die 102), and at least a third material comprising the materials of either or both of the first fill 114 and the second fill 116. In an embodiment, the third material can be selected to increase the melting point of an alloy including the third material and at least one of the first material or the second material. In various embodiments, the conductive alloy mass 202 includes a third material comprising at least the first fill 114 and a fourth material comprising at least the second fill 116.

In another embodiment, the eutectic alloy mass 202 comprises an electrically conductive alloy mass 202 joined to the first and second conductive interconnect features 110, where the conductive alloy mass 202 includes a first material comprising the material of the first fill 114, a second material comprising the material of the second fill 116, and at least a third material comprising an alloy or a compound of the materials of the first fill 114 and the second fill 116. In the embodiment, the third material can be selected by a selection of the first 114 and second 116 fills to increase the melting point of an alloy including the third material and at least one of the first material or the second material. In various embodiments, the conductive alloy mass 202 includes one or more layers or materials (e.g., metals or other conductive materials) in addition to the materials of the first fill 114 and the second fill 116.

In the embodiments, a concentration of the first material can vary from a relatively higher amount at a location disposed toward the first interconnect feature 110 (or the first die 102) to a relatively lower amount toward the second interconnect feature 110 (or the second die 102), and a concentration of the second material can vary in concentration from a relatively higher amount at a location disposed toward the second interconnect feature 110 (or the second die 102) to a relatively lower amount toward the first interconnect feature 110 (or the first die 102). In an embodiment, the third material has a highest concentration at a location between a first highest concentration of the first material and a second highest concentration of the second material.

In other applications, the concentration of the first fill layer 114 or second fill layer 116 in the bonded conductive feature 204 is less than 25% and preferably less than 10% of the bonded conductive feature 204. Also, in some embodiments, after the initial bonding operation, materials of the first fill layer 114 or the second fill layer 116 may diffuse and/or inter-diffuse into the first or second conductive features 110 during subsequent processing steps or during field use. Thus, the alloy mass 202 formed by the first and second fill layers 114, 116 may comprise a distinct region in the bonded conductive features 204. In other situations as discussed earlier, the first fill layer 114 or the second fill layer 116 may diffuse into the first or second conductive features 110, and their concentration can be more diffuse, where the local concentration of the first fill layer 114 or the second fill layer 116 is less than 5%, and preferably less than 1% of the surrounding conductive material (e.g., the material of interconnects 110).

In various implementations, the alloy mass 202 is formed at low temperatures (e.g., ambient, room temperature, less than 100° C.) and provides a bond with reliable strength and conductivity without higher temperature annealing. For instance, the strength and reliability of the low temperature bond including the alloy mass 202 can be equivalent to or substantially similar to a bond formed through higher temperature annealing.

Although the interconnects 204 between the bonded dies 102 may be formed using the low temperature alloy mass 202, in some embodiments, at least one or more interconnects 204 between the bonded dies 102 may be formed using a hybrid bonding of metal material (e.g. copper) from one interconnect 110 of a first die 102, to metal material (e.g. copper) from another interconnect 110 of a second die 102. For example, while some interconnects 204 are formed with an alloy 202 within the interconnect 204, there may be other interconnects 204 with no alloy 202 within the interconnect 204. In some other embodiments, the contact region between bonded interconnects 110 may be partially formed of a combination of an alloy 202, a copper-to-copper bond, or even include some voids.

In practice the bottom and the top substrates 104 may be similar or identical in geometric proportions. As shown at FIG. 1G, one or more of the substrates 104 of the bonded dies 102 (e.g., the microelectronic assembly 118) may be thinned as desired for further processing or packaging. In other applications, the bottom substrate 104 may be significantly larger than the top substrate 104. For example, the bottom substrate 104 may be comprised of a 200 or 300 mm silicon wafer, or the like, while the top substrate 104 may be comprised of a die 102 that is significantly smaller than the bottom substrate 104. Multiple dies 102 may be bonded to the planarized bonding surface 108 of the bottom substrate 104. The bonded dies 102 may be processed for additional bonding operations, for example, stacking other cleaned dies 102 to the initially bonded dies 102, and so forth. Also, the bottom larger substrate 104 may be further processed, for example, thinning or singulation operations or both, to separate the various bonded dies 102 for subsequent operations.

In various embodiments, the techniques described herein can be used to remedy or mitigate the effects of unintentionally recessed interconnect structures in the surfaces of microelectronic components to be bonded. At least partially filling the excessive recesses 112 in the interconnect features 110 with the one or more additional metal fill layers (114, 116) provides for an improved bonding surface (e.g., less surface topology variance). Direct and hybrid bonding with the improved surface flatness can result in improved and more reliable bonds between the microelectronic components (e.g., dies 102). Further, improved bonds between the interconnect features 110 of the respective dies 102 is achievable with lower temperatures due to the alloy mass 202 formed at the bond joint.

As mentioned above, in other implementations, recesses 112 may be intentionally formed in the exposed surfaces of one or more of the interconnect features 110 to be bonded, to apply the techniques described. For example, either of these scenarios can be illustrated with regard to the process 300 of FIGS. 2A-2E. As shown at FIG. 2A, in an implementation, the process 300 includes forming the conductive features 110 in the insulating layer 106 using a damascene process, for instance. A recess 112 of predetermined size and shape (e.g., area and depth "d1") can be unintentionally or intentionally formed in the surface of one or more of the interconnect features 110 of one or both of two dies 102 to be bonded. In one embodiment, portions of conductive features 110 may be selectively partially removed with respect to the bonding surface of dielectric 106 to a predetermined depth by etching methods, or the like.

In various implementations, the recess 112 can be intentionally created by patterning and etching the features 110, for example. A photoresist can be applied (not shown) to the feature 110 surface to pattern the feature 110 for predetermined recess 112 locations. The resist can be exposed and then the surface of the feature 110 etched to form the desired recess(es) 112. In various implementations, the predetermined recesses 112 can have a depth "d1" of tens of nanometers to hundreds of nanometers (e.g., 50 to 500 nm), or even deeper as desired.

In alternate implementations, the recess 112 can be created by CMP, or the like, for example when the recess 112 is formed on a large metallic feature 110 during planarization, as described above. In an example, the depth "d1" of the recess 112 can be greater than 15 nm.

As shown at FIG. 2B, bonding the two dies 102 to form the microelectronic assembly 118 without mitigating the recesses 112 can leave voids or gaps 302 between the features 110. The gaps 302 comprise massive defects in the bonds, and can prevent the interconnect structures 204 from being formed, or from being reliably formed from the respective features 110. The massive defects from the gaps 302 can result in premature failure or low device yield.

In an embodiment, the process 300 includes adding one or more fill layers 114, 116, as described above to mitigate the recess(es) 112 and the gaps 302. For instance, as shown at FIG. 2C, a first metal fill layer 114 is formed, added, deposited, coated, or the like, on the exposed surface of the first interconnect features 110 of the first die 102, as described above. As shown at FIG. 2D, a second metal till layer 116 is formed, added, deposited, or the like, on the exposed surface of the second interconnect features 110 of the second die 102, as described above.

As shown at FIG. 2E, the first and second dies 102 are bonded using direct dielectric to dielectric bonding (without adhesive), at room temperature (e.g., below 100 degrees C.). The bonding of the first and second dies 102 forms a microelectronic assembly 118. In the process, the first fill layer 114 and the second fill layer 116 are pressed together, to bond the interconnect features 110 into a solid interconnect structure 204, with the first fill layer 114 and the second fill layer 116 combining to form an alloy mass 202, which physically and electrically bonds the respective interconnect features 110, forming the interconnect structure 204. In some embodiments, the composition of the alloy mass 202 may comprise a eutectic alloy or a composition close to an eutectic alloy mass.

In some embodiments, a small gap may remain within the alloy mass 202 after bonding (not shown). If the gap is small, it may be inconsequential. However, if the gap is large, it may lead to failures. In that case, the thickness of one or both of the first 114 and/or second 116 fill layers can be increased prior to bonding. Alternately, one or more additional fill layers can be added (additional to the first 114 and second 116 fill layers) prior to bonding to reduce or eliminate the gap.

In various embodiments, the alloy mass 202 has a non-linear concentration of materials, as described above. For example, within the alloy mass 202, a concentration of the material of the first fill 114 can vary from a relatively higher amount at a location disposed toward the first interconnect feature 110 (or the first die 102) to a relatively lower amount toward the second interconnect feature 110 (or the second die 102), and a concentration of the material of the second fill can vary in concentration from a relatively higher amount at a location disposed toward the second interconnect feature 110 (or the second die 102) to a relatively lower amount toward the first interconnect feature 110 (or the first die 102). In an embodiment, a third material comprising an alloy or compound of the first 114 and second 116 materials has a highest concentration within the alloy mass 202 at a location between a first highest concentration of the first material and a second highest concentration of the second material.

In various implementations, the alloy mass 202 is formed at low temperatures (e.g., ambient, room temperature, less than 150° C.) and provides a bond with reliable strength and adequate conductivity. For instance, the strength of the low temperature bond including the alloy mass 202 is equivalent to or substantially similar to a bond formed through higher temperature annealing.

Figure 3B:
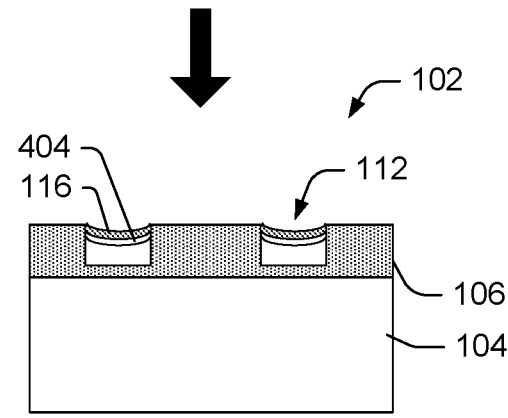
Figure 3C:
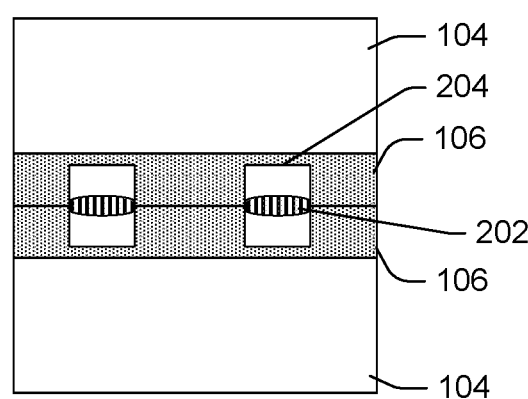

Referring to FIGS. 3A-3C, a process 400 is shown as an alternate implementation of the process 300. For example, FIGS. 3A, 3B, and 3C may be inserted as additional or alternate process steps for the process 300. At FIGS. 3A and 33, barrier layers 402 and/or 404 (such as nickel, nickel alloys or the like) are deposited onto the recess 112 of one or both dies 102 prior to the first 114 and/or second 116 fill layers. As the dies 102 are bonded together, as shown at FIG. 3C, the first 114 and second 116 fill layers are mated intimately, and form the alloy mass 202 as described above. In alternate embodiments, the barrier layers 402 and/or 404 may or may not combine with the fill layers 114, 116 and/or feature 110 materials to become part of the alloy mass 202.

Figure 4A:
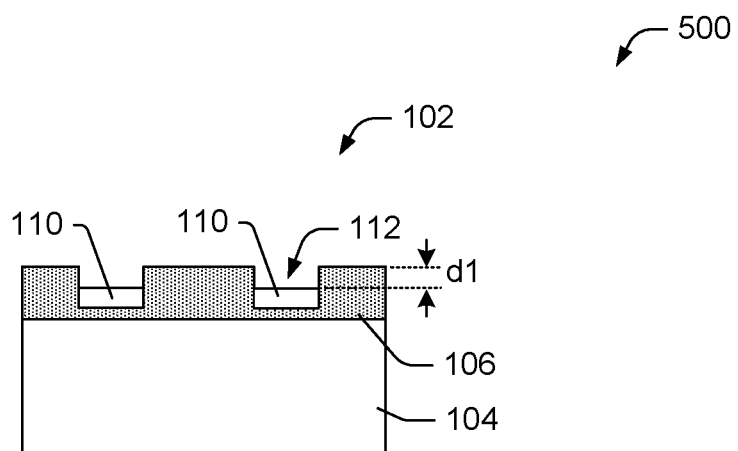
FIGS. 4A-4C include a graphical flow diagram illustrating another example process for forming and bonding dies, according to an embodiment.
Figure 4B:
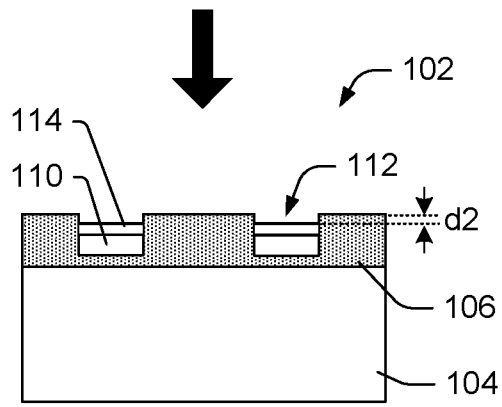
Figure 4C:
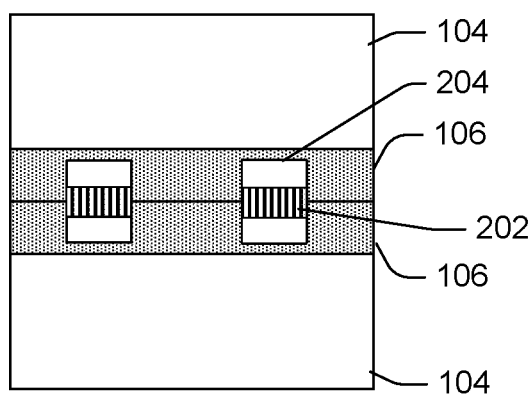

FIGS. 4A-4C show a process 500 illustrating the use of electroless metal deposition, as a technique for forming the first fill layer 114 and/or the second fill layer 116. The process 500 may be particularly useful in cases where the recess 112 may be particularly deep (e.g., "d1">50 nm), FIG. 4A illustrates a die 102 with an excessively deep recess 112, either intentionally or unintentionally (e.g., CMP planarization). In an embodiment, the excessively deep recess 112 can be due to one of the dimensions of the recess 112, for example (e.g., greater than 0.05 mm) or the large size of the surface area of the features 110.

At FIG. 4B, an electroless process, such as direct replacement reaction or auto-catalytical metal deposition, for instance, is used to selectively deposit the fill layer 114 onto the exposed surface of the conductive feature 110 with precision control. The till layer 114 is deposited at a preselected thickness to reduce the recess 112 to a predetermined depth ("d2") as desired, to meet direct bonding requirements.

In an implementation, the electroless process comprises an immersion silver, copper, or gold process. In another implementation, a seed deposition of palladium, for example, is followed by a deposition of nickel, or the like. For instance, the nickel deposition may be made by a hypophosphite-based immersion process, after depositing the seed layer. In various embodiments, the reducing agent for the immersion process includes one or more of sodium hypophosphite, sodium borohydride, dimethylamine borane, hydrazine, or the like.

At FIG. 4C, two of the dies 102 with the fill layers 114 are bonded together to form the microelectronic assembly 118. As above, the fill layers 114 form an alloy mass 202, which bonds (at low temperatures) the conductive features 110 to form a solid interconnect structure 204.

Figure 5:
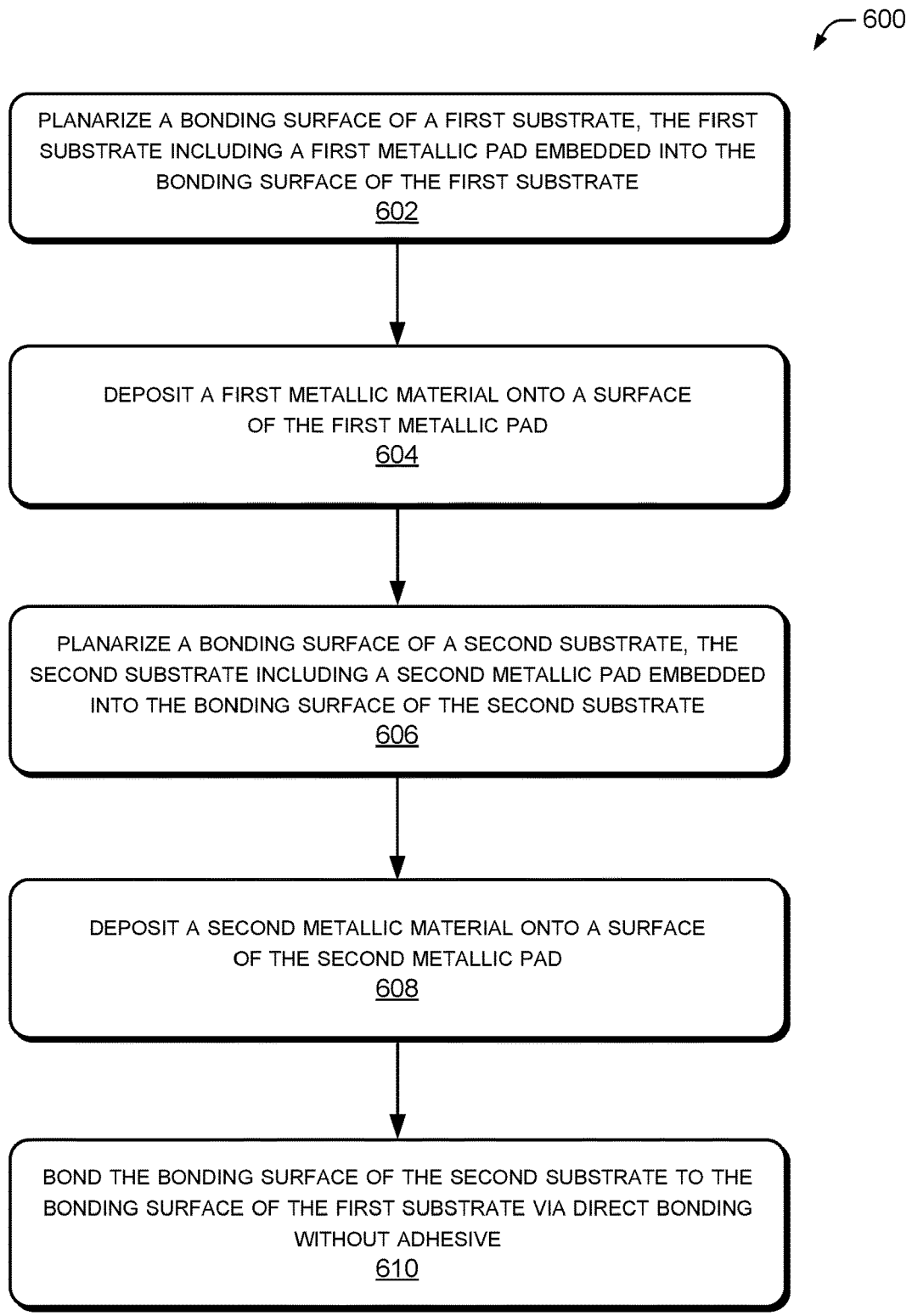
FIG. 5 is a flow diagram illustrating an example process for forming and bonding dies, according to an embodiment.

The electroless deposition technique has several advantages, including the lack of a need for lithography, no vacuum or heat is used, and no additional CMP is required after deposition. Other advantages will also be apparent to a person having skill in the art, FIG. 5 is a flow diagram illustrating an example process 600 for forming and bonding microelectronic components (such as dies 102, for example), according to an embodiment. For instance, at block 602, the process includes planarizing a bonding surface (such as the bonding surface 108, for example) of a first substrate (such as a first die 102, for example). In the embodiment, the first substrate includes a first metallic pad (such as conductive feature 110, for example) embedded into the bonding surface of the first substrate.

At block 604, the process includes depositing a first metallic material (such as first fill layer 114, for example) onto a surface of the first metallic pad. In an implementation, the process includes forming a first recessed portion (such as recess 112, for example) in a surface of the first metallic pad and at least partially filling the first recessed portion with the first metallic material. In various embodiments, the recess is the product of one or more process steps, and may be intentional or unintentional.

In an implementation, the process includes depositing a conductive barrier layer (such as barrier 402, for example) onto the surface of the first metallic pad prior to depositing the first metallic material. In an alternate embodiment, the process includes depositing multiple fill layers, barrier layers, or combinations of the same.

At block 606, the process includes planarizing a bonding surface of a second substrate (such as a second die 102, for example). The second substrate includes a second metallic pad embedded into the bonding surface of the second substrate.

At block 608, the process includes depositing a second metallic material (such as second fill layer 116, for example) onto a surface of the second metallic pad. In an implementation, the process includes forming a second recessed portion in a surface of the second metallic pad and at least partially filling the second recessed portion with the second metallic material. In various embodiments, if present, the recess is the product of one or more process steps, and may be intentional or unintentional.

In an implementation, the process includes depositing a conductive barrier layer (such as barrier layer 404, for example) onto the surface of the second metallic pad prior to depositing the second metallic material. In an alternate embodiment, the process includes depositing multiple fill layers, barrier layers, or combinations of the same.

In an implementation, the process includes depositing the first metallic material and/or the second metallic material via immersion electroless metal deposition. In some embodiments, the melting point of the first fill layer and/or the second fill layer may be higher than the melting point of the conductive features 110. For example, the first fill layer and/or the second fill layer may be comprised of a very thin layer of nickel, cobalt, or manganese, or their various alloys, while the conductive features may be comprised of copper or of copper alloys, for example.

The deposited first fill layer and/or the second fill layer may be continuous or discontinuous, and the thickness of the first fill layer and/or the second fill layer may range between 0.5 to 500 nm, and preferably between 1 to less than 50 nm. In some embodiments, the first fill layer and/or the second fill layer may be comprised of an alloy of at least one higher-temperature melting point metal and at least one lower-temperature melting point metal, for example, a cobalt-tin or cobalt-indium alloy, or the like, or an element with a relatively low concentration of one or more impurities. The composition of the alloy or element may include a proportion of the fill material (or impurities) that is less than 2% of the total composition of the interconnect pads combined, or less than 5000 ppm, or less than 500 ppm.

In one embodiment, the first fill layer and/or the second fill layer is thinner than the respective conductive feature. In one application, the first till layer and/or the second fill layer is at least 5 times thinner than the thickness of the respective conductive feature.

At block 610, the process includes bonding the bonding surface of the second substrate to the bonding surface of the first substrate via direct dielectric-to-dielectric bonding without adhesive. In an implementation, the process includes pressing the first metallic pad to the second metallic pad during, the bonding, and forming an alloy mass (such as alloy mass 204, for example) between the first metallic pad and the second metallic pad. In the implementation, the alloy mass comprises an alloy of the first and second metallic materials. In an embodiment, the process includes bonding the second metallic pad to the first metallic pad via the alloy mass, to form a single solid interconnect structure (such as interconnect structure 204, for example). In another embodiment, a concentration of the first metallic material and a concentration of the second metallic material of the alloy mass is non-linear throughout the alloy mass.

During the bonding process, the conductive features of the top substrate and the composite conductive features of the bottom substrate (comprising the lower melting point conductive features and the higher melting point fill layer), thermally deforms to mate intimately, and atoms from the conductive features (for example copper) diffuse into the fill layer (for example cobalt). In this configuration, the bonded substrate can include a portion having a conductive interconnect structure comprised of mostly copper, for example, and another portion having an interconnect structure including an alloy mass (for example, a copper-cobalt alloy mass) comprised of the conductive feature (e.g., copper) and a fill layer (e.g., cobalt).

In various embodiments, some process steps may be modified or eliminated, in comparison to the process steps described herein.

The techniques, components, and devices described herein are not limited to the illustrations of FIGS. 1A-5, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A microelectronic assembly, comprising:
a first substrate having a first bonding surface;
a first metallic feature disposed at the first bonding surface of the first substrate, and having a first conductive material disposed on a surface of the first metallic feature;
a second substrate having a second bonding surface; the second bonding surface bonded to the bonding surface of the first substrate;
a second metallic feature disposed at the second bonding surface, and having a second conductive material disposed on a surface of the second metallic feature, wherein the second metallic feature is bonded to the first metallic feature; and
an alloy mass disposed between the first metallic feature and the second metallic feature, the alloy mass comprising an alloy of the first and the second conductive materials, wherein a concentration of the first conductive material and a concentration of the second conductive material of the alloy mass is non-linear throughout the alloy mass.

2. The microelectronic assembly of claim 1, further comprising a first recessed portion disposed in a surface of the first metallic feature and extending a preselected depth below the bonding surface of the first substrate, the first recessed portion at least partially filled with the first conductive material, wherein the first conductive material is different than a conductive material of the first metallic feature.

3. The microelectronic assembly of claim 2, further comprising a second recessed portion disposed in a surface of the second metallic feature and extending a preselected depth below the bonding surface of the second substrate, the second recessed portion at least partially filled with the second conductive material, wherein the second conductive material is different than a conductive material of the second metallic feature.

4. The microelectronic assembly of claim 3, further comprising a barrier layer disposed within the first recessed portion, the second recessed portion, or the first recessed portion and the second recessed portion, the barrier layer comprising a third conductive material different from the first or second conductive materials and different than the conductive materials of the first or second metallic features.

5. The microelectronic assembly of claim 1, wherein a melting point of the alloy mass is higher than respective melting points of the first and second conductive materials.

6. The microelectronic assembly of claim 1, wherein the bonding surface of the second substrate is bonded to the bonding surface of the first substrate via direct bonding without adhesive.

7. The microelectronic assembly of claim 1, wherein the first conductive material comprises a discontinuous layer on the surface of the first metallic feature and/or the second conductive material comprises a discontinuous layer on the surface of the second metallic feature, the first conductive material being different from a material of the first metallic feature and the second conductive material being different from a material of the second metallic feature.

8. A microelectronic assembly, comprising:
a first substrate having a first surface with a first conductive interconnect structure;
a second substrate having a second surface with a second conductive interconnect structure, the first surface bonded to the second surface and the first conductive interconnect structure bonded to the second conductive interconnect structure; and
an electrically conductive alloy mass coupling the first conductive interconnect structure to the second conductive interconnect structure, wherein the conductive alloy mass includes a first material, a second material, and a third material, wherein a concentration of the first material, a concentration of the second material, and a concentration of the third material is non-linear throughout the alloy mass.

9. The microelectronic assembly of claim 8, further comprising a first recessed portion disposed in a surface of the first conductive interconnect structure and a second recessed portion disposed in a surface of the second conductive interconnect structure, the first recessed portion at least partially filled with the first material and the second recessed portion at least partially filled with the second material.

10. The microelectronic assembly of claim 9, further comprising a conductive barrier layer disposed within the first recessed portion and/or the second recessed portion.

11. The microelectronic assembly of claim 8, wherein the alloy mass comprises a eutectic alloy mass.

12. The microelectronic assembly of claim 8, wherein a concentration of the first material varies from a relatively higher amount at a location disposed toward the first conductive interconnect structure to a relatively lower amount toward the second conductive interconnect structure, wherein a concentration of the second material varies in concentration from a relatively higher amount at a location disposed toward the second conductive interconnect structure to a relatively lower amount toward the first conductive interconnect structure, and wherein the third material has a highest concentration at a location between a first highest concentration of the first material and a second highest concentration of the second material.

13. The microelectronic assembly of claim 8, wherein the first conductive interconnect structure is recessed relative to the first surface of the first substrate and the second conductive interconnect structure is recessed relative to the second surface of the second substrate.

14. The microelectronic assembly of claim 8, further comprising a first non-metallic region located at the first surface proximate to the first conductive interconnect structure and a second non-metallic region located at the second surface proximate to the second conductive interconnect structure, the second non-metallic region in contact with and directly bonded to the first non-metallic region without adhesive.

15. A microelectronic assembly, comprising:
a first substrate having a first surface with a first conductive structure;
a second substrate having a second surface with a second conductive structure; the first substrate intimately bonded to the second substrate and the first conductive structure bonded to the second conductive structure; and
an electrically conductive alloy region coupling the first conductive structure to the second conductive structure, wherein the conductive alloy region includes a first material and a second material, and wherein a volume of the first material or a volume of the second material is less than 10% of a volume of the first conductive structure and the second conductive structure combined.

16. The microelectronic assembly of claim 15, wherein the first material, the second material, or the first material and the second material comprises palladium or cobalt.

17. The microelectronic assembly of claim 15, wherein the volume of the first material or the volume of the second material is less than 5% of the volume of the first conductive structure and the second conductive structure combined.

18. The microelectronic assembly of claim 15, wherein the first substrate is directly bonded to the second substrate without adhesive and the first conductive structure and the second conductive structure are bonded by thermal deformation.

19. A microelectronic assembly, comprising:
- a first substrate having a first surface with a first conductive structure, a portion of e first conductive structure comprising a first conductive material;
- a second substrate having a second surface with a second conductive structure, the first surface of the first substrate intimately bonded to the second surface of the second substrate and the first conductive structure bonded to the second conductive structure; and
- an electrically conductive alloy region coupling the first conductive structure to the second conductive structure, wherein the alloy region includes the first conductive material, the first conductive material having a higher melting point than a melting point of portions of the first conductive structure or the second conductive structure.

20. The microelectronic assembly of claim 19, wherein the first conductive structure, the second conductive structure, or the first conductive structure and the second conductive structure are comprised of multiple layers of different conductive materials.

21. The microelectronic assembly of claim 19, wherein the alloy region comprises cobalt, nickel, and/or manganese.

22. The microelectronic assembly of claim 19, wherein the alloy region has a thickness that is less than a thickness of the first conductive structure or the second conductive structure.

* * * * *

UNITED STATES PATENT AND TRADEMARK OFFICE
CERTIFICATE OF CORRECTION

PATENT NO. : 11,515,279 B2
APPLICATION NO. : 16/995988
DATED : November 29, 2022
INVENTOR(S) : Cyprian Emeka Uzoh It is certified that error appears in the above-identified patent and that said Letters Patent is hereby corrected as shown below:

In the Specification

Column 2, Line 1, after "topology" insert -- (i.e., --.

Column 4, Line 13 (approx.), after "components" insert -- (i.e., --.

Column 4, Line 14 (approx.), delete "a" and insert -- are --.

Column 4, Line 21 (approx.), after "structures" insert -- (e.g., --.

Column 4, Line 59 (approx.), after "order" insert -- to --.

Column 6, Line 59, after "conductive" insert -- (e.g., --.

Column 8, Line 18, delete "implementations, in" and insert -- implementations. In --.

Column 9, Line 31, delete "till" and insert -- fill --.

Column 11, Line 46, delete "till" and insert -- fill --.

Column 12, Line 35, delete "33," and insert -- 3B, --.

Column 12, Line 48, delete "nm)," and insert -- nm). --.

Column 12, Line 59, delete "till" and insert -- fill --.

Column 13, Line 15, delete "art," and insert -- art. --.

Column 14, Line 19, delete "till" and insert -- fill --.

Signed and Sealed this
Twelfth Day of September, 2023

Katherine Kelly Vidal
*Director of the United States Patent and Trademark Office*

Column 14, Line 27 (approx.), delete "during," and insert -- during --.

In the Claims

Column 15, Line 15 (approx.), In Claim 1, delete "surface;" and insert -- surface, --.

Column 17, Line 18, In Claim 19, delete "e" and insert -- the --.